United States Patent
Burdick et al.

(10) Patent No.: US 7,338,216 B2
(45) Date of Patent: Mar. 4, 2008

(54) TRANSMITTER SUBASSEMBLY GROUND RETURN PATH

(75) Inventors: Stephan C. Burdick, Cupertino, CA (US); Andreas G. Weber, Los Altos, CA (US)

(73) Assignee: Finisar Corporation, Sunnyvale, CA (US)

( * ) Notice: Subject to any disclaimer, the term of this patent is extended or adjusted under 35 U.S.C. 154(b) by 497 days.

(21) Appl. No.: 10/814,327

(22) Filed: Mar. 31, 2004

(65) Prior Publication Data

US 2004/0190835 A1    Sep. 30, 2004

Related U.S. Application Data

(60) Provisional application No. 60/459,333, filed on Mar. 31, 2003.

(51) Int. Cl.
G02B 6/36       (2006.01)
H04B 10/00    (2006.01)

(52) U.S. Cl. ............................ 385/88; 385/92; 398/115; 398/116; 398/117; 398/135; 398/138; 398/139

(58) Field of Classification Search ................. 385/88, 385/92; 398/115–117, 135, 138, 139
See application file for complete search history.

(56) References Cited

U.S. PATENT DOCUMENTS

2002/0027689 A1*   3/2002  Bartur et al. ............... 359/152
2002/0028048 A1*   3/2002  Dair et al. ..................... 385/92
2003/0180013 A1*   9/2003  Rosenberg et al. ........... 385/92

* cited by examiner

*Primary Examiner*—Frank G. Font
*Assistant Examiner*—Derek L. Dupuis
(74) *Attorney, Agent, or Firm*—Workman Nydegger

(57) ABSTRACT

A transmitter subassembly ground return path comprises a coupling member having a plurality of layers. At least one of the layers includes a signal trace layer that has one or more signal traces coupling components of a transceiver substrate to components of the transmitter subassembly. At least one of the one or more signal traces can be coupled to a signal coupling capacitor. At least one of the ground plane layers can connect the body of the transmitter subassembly to one or more common mode grounding capacitors. The ground plane layers of the coupling member also shield at least some of the electromagnetic radiation that can emanate from the signal trace layer in high frequency data transmissions.

20 Claims, 6 Drawing Sheets

TRANSMITTER SUBASSEMBLY GROUND RETURN PATH

CROSS-REFERENCE TO RELATED APPLICATIONS

This application claims priority to U.S. Provisional Patent Application Ser. No. 60/459,333, filed on Mar. 31, 2003, entitled "A TRANSMITTER SUBASSEMBLY GROUND RETURN PATH", the contents of which are incorporated herein in its entirety.

BACKGROUND OF THE INVENTION

1. The Field of the Invention

The invention relates generally to minimizing the effects of electromagnetic radiation in optical transceiver modules.

2. Background and Relevant Art

Today, communication systems using optical fiber as a means for transmission are widely employed for a variety of purposes, ranging from a basic transmission line in public communication channels to a short-distance network such as a LAN (local area network). Since most of the devices connected by these optical fibers are electronic devices rather than optical devices, optical transceivers are commonly placed at the interface between the optical fibers and the electronic devices.

An optical transceiver includes a transceiver substrate, such as a printed circuit board (PCB), that is connected to a transmitter unit and a receiver unit, and is enclosed in a module housing, or shell. The receiver unit, which usually includes a photodiode, receives optical signals and converts them into electrical signals for a host device. The transmitter unit, which includes a laser source such as a laser diode (or a light emitting diode), receives the electrical signals from the host device and converts them into optical signals. These converted signals can then be transmitted to yet another device. The receiver unit and the transmitter unit are often coupled to the transceiver substrate, and are generally referred to as a Receiver Optical Subassembly (ROSA) and a Transmitter Optical Subassembly (TOSA), respectively.

With reference to a TOSA, a component on the transceiver substrate, such as a laser driver component, sends an electronic signal through an alternating current (AC) "in" to the TOSA's laser source. The AC continues beyond the laser source and returns "out", or back to the laser driver component, and then cycles back in again to the TOSA in a continuous cycle. As such, the AC loop can be thought of as having two AC circuit paths: an in path, and an out path. In conventional optical transceivers, particularly small form factor (e.g., SFF, SFP, and XFP) optical transceivers, these in and out paths are placed fairly close together.

At some point along the AC pathway, it is sometimes necessary to bias the AC by adding a direct current (DC, also referred to herein as "bias current") to the AC on the way in to the TOSA. Unfortunately, it is also desirable to shield the laser driver, which drives the AC, from the DC bias levels. As such, DC is typically isolated from the AC by placing one or more capacitors along the AC in/out loop since the DC does not pass through a capacitor. Accordingly, the DC can be applied to the portion of the circuit connected to the TOSA, but not to the portion connected to the (laser) driver.

In addition, to a differential signal from the transceiver substrate to the TOSA, there is typically a certain amount of common mode signal along the same path. Simplistically, a common mode signal is a common signal appearing on two conductors that are intended to carry a differential signal. That is, if the voltage on path A increases when the voltage on path B decreases and vice versa, that is a differential signal, but if the signal on both A and B increases or decreases simultaneously, that is a common mode signal. In conventional transceivers, there is no circuitry set aside for providing a ground return for the common mode signal. In particular, the default return path for the common mode signal has been through the TOSA shell, and hence onto the transceiver chassis. This is because the TOSA shell is the closest (or only) return path in conventional transceivers, and also the path of lowest impedance.

Unfortunately, relatively high currents are now required to adequately drive the laser source component in the TOSA. Because such currents are switching at increasingly high frequencies, common mode electronic signals become increasingly problematic, particularly since the common mode signals simply propagate to the TOSA shell. In particular, common mode signals in high current systems can cause data errors, electromagnetic emissions above regulatory limits, and in some limited cases may result in damage to the TOSA and related optical transceiver components.

Electromagnetic radiation emitted by such signals, if not shielded properly, can result in cross-talk that interferes with operation of nearby optical and electronic devices. Such cross talk also becomes more problematic as optical transceivers shrink in size and the transceiver components are placed closer to each other. In particular, a ROSA is highly sensitive to any signal interference from cross talk since a signal received by a ROSA is highly amplified. One will appreciate therefore that high speed data transmissions present special challenges in an optical transceiver environment.

As such, an advantage in the art can be realized with systems that can appropriately nullify the negative effects of extraneous common-mode signals in high frequency data transmissions. Moreover, an advantage in the art can be realized with such systems that shield residual electromagnetic radiation between optical components, thereby improving data transmission and reception integrity.

BRIEF SUMMARY OF THE INVENTION

Exemplary implementations of the present invention include systems, apparatus, and methods for nullifying negative effects of extraneous common-mode signals, as well as for shielding electromagnetic radiation and its effects in, and external to, optical transceiver devices.

In at least one exemplary implementation, an optical subassembly (OSA) is communicatively coupled to a transceiver substrate using a coupling member, such as a flexible PCB, that has a plurality of layers. The layers can include one or more layers having circuit traces that cyclically transmit and receive current from components on the transceiver substrate to components inside the OSA, and two or more ground plane layers surrounding the circuit trace layers. The circuit traces for cyclically transmitting and receiving current comprise one or more capacitors for isolating DC from AC.

The two or more ground plane layers provide connections for grounding a common mode signal that reaches the OSA shell. The two or more ground plane layers connect the OSA shell to a capacitor on the transceiver substrate along a connection path that is different from the circuit traces for transmitting and receiving current. This can therefore provide an AC common mode path that maintains DC isolation.

Furthermore, the two or more ground plane layers perform the function of electromagnetic shielding. Since the two ground plane layers surround the circuit trace layer of the coupling member, remaining electromagnetic radiation that is not otherwise minimized through the common mode ground is shielded, and thus prevented from emanating from the circuit trace layer. Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention relates generally to systems, apparatus, and methods for nullifying negative effects of extraneous common-mode signals, as well as for shielding electromagnetic radiation and its effects in and around optical transceiver devices. One will also appreciate, however, that the teachings of the present invention are applicable to any electrical device that can benefit from electromagnetic radiation minimization and/or shielding.

Figure 1:
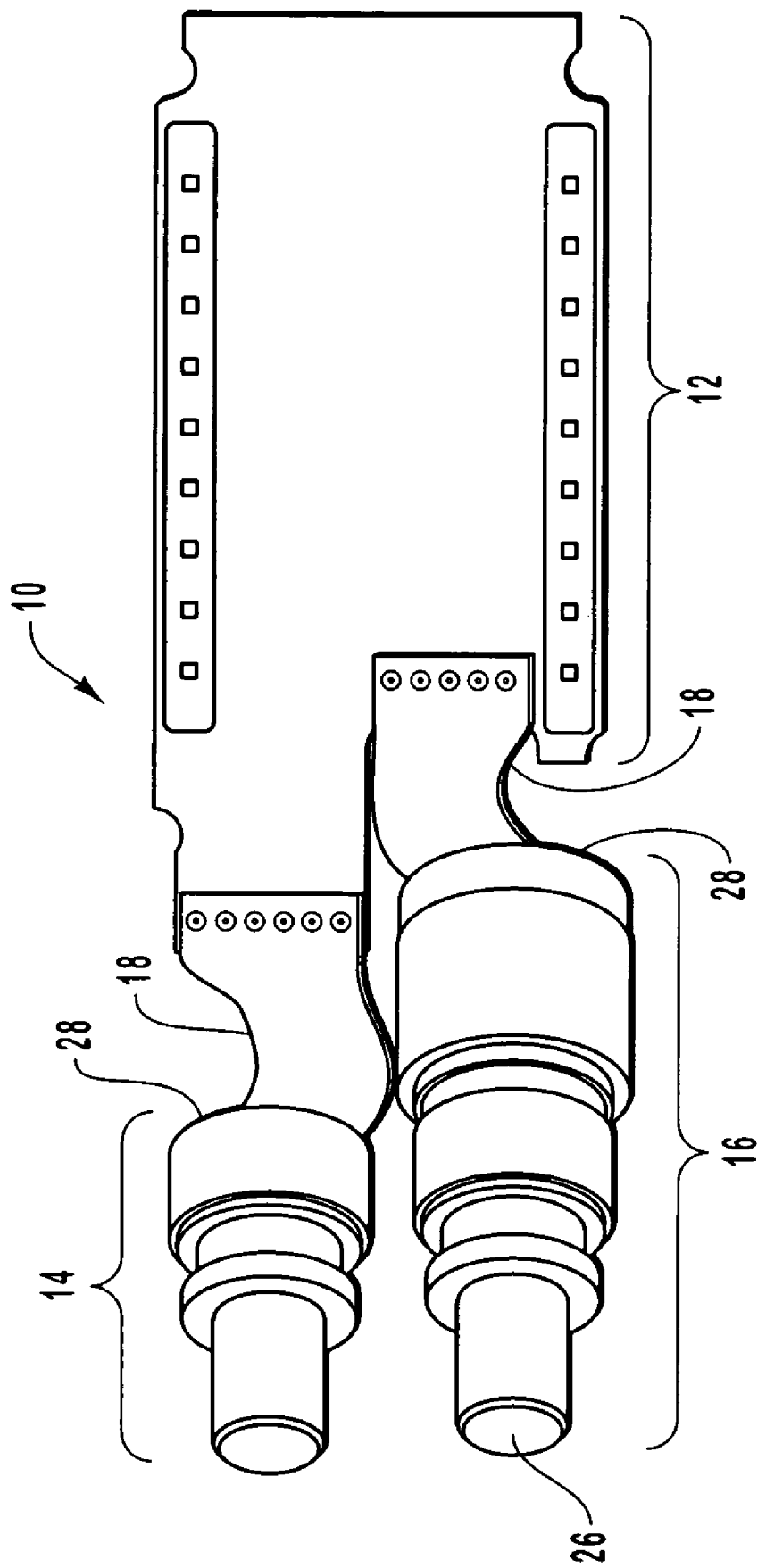
FIG. 1 illustrates an optical transceiver in accordance with an exemplary embodiment of the present invention.

FIG. 1 illustrates an overview perspective of an exemplary embodiment of an optical transceiver 10 in which ROSA 14 and TOSA 16 (sometimes referred to herein generically as "OSAs") are connected to a transceiver substrate 12. In particular, FIG. 1 illustrates a ROSA 14, and a TOSA 16, each connected to a transceiver substrate 12 through a coupling member 18. For the purposes of this specification and claims, each OSA will be defined as having a front end 26 and a back end 28. The front end 26 is the portion of the relevant OSA that can be coupled to an optical signal transfer medium, such as an optical fiber (not shown). The corresponding OSA back end 28, in turn, comprises the portion of the relevant OSA that can connect to the transceiver substrate 12 via a coupling member 18, such as a cable.

As shown, therefore, one end of the coupling member 18 connects to the back end 28 of the ROSA 14 and the TOSA 16, and the other end of the coupling member 18 connects to the transceiver substrate 12. As described herein, the coupling member 18 may comprise any suitable materials commonly used with conventional flexible circuits, such as ribbon materials with one or more circuit traces embedded therein. By contrast with such flexible circuits, however, coupling member 18 will also be described as having multiple layers, each providing avenues of conductivity. Coupling member 18 will also be described with various conductive parts for coupling conductive leads extending from an OSA 14, 16, and/or transceiver substrate 12.

Figure 2:
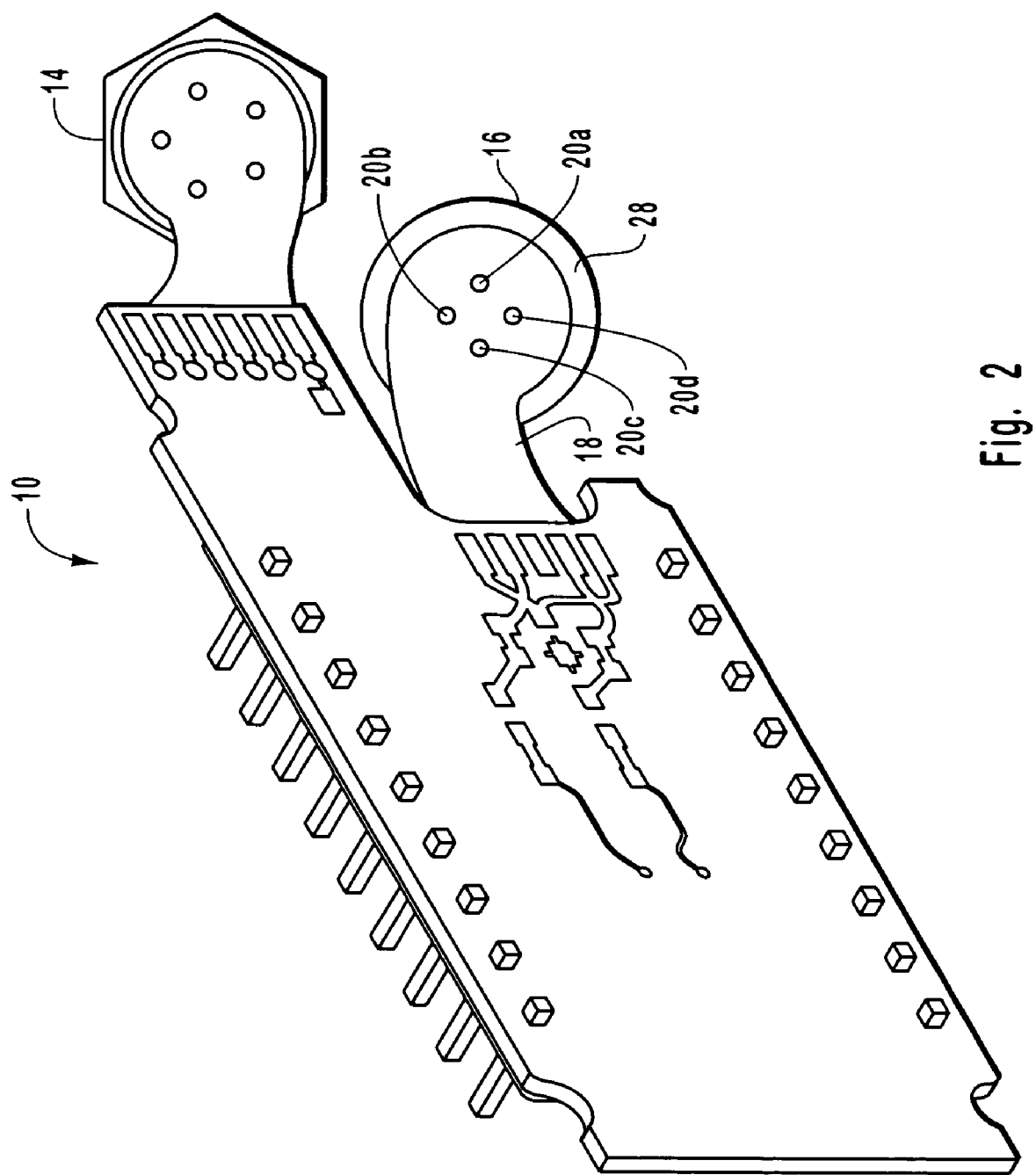
FIG. 2 illustrates an OSA connected to a coupling member in accordance with an exemplary embodiment of the present invention.

In particular, FIG. 2 illustrates the back end 28 of the TOSA 16 that is connected to the coupling member 18. In at least one embodiment of the present invention, the back end of a TOSA 16 comprises a plurality of conductive pins 20a, 20b, 20c, and 20d (sometimes collectively referred to herein as pins 20). Each of pins 20a-20d, in turn, is electrically connected to the coupling member 18. One will appreciate, however, after reading this specification and claims that embodiments of the present invention are not limited to four conductive pins 20 extending from a given OSA. Indeed, there may be more or fewer conductive pins in accordance with the present invention depending on a manufacturer's preferences, so long as there are a minimal number of connections for sending signals, and for ground signals, in accordance with the concepts of the present invention. Moreover, the invention is not necessarily limited to conductive "pins" as such, inasmuch as other conductive coupling elements known in the art will suffice.

In any case, pin 20a is coupled to the outer body (sometimes also referred to herein as the "shell") of the TOSA 16, which is a connection to the chassis. By contrast, pins 20b, 20c, and 20d are coupled to components inside the TOSA 16, rather than the TOSA shell, or to the chassis. Since pins 20b, 20c, and 20d are not connected to the TOSA shell, pins 20b, 20c, and 20d are therefore isolated from chassis ground. Accordingly, at least one conductive pin (e.g., pin 20a in this case) will connect to a given OSA shell, and at least one conductive pin (e.g., pins 20b-20d in this case) will connect only to one or more components inside the OSA.

To connect the conductive pins 20 to the coupling member 18, FIG. 2 illustrates an exemplary implementation in which the coupling member 18 can comprise flex vias through which pins 20a-20d may extend. One will appreciate, however, that there can be many different ways of connecting the coupling member 18 to the TOSA 16, such that flex vias and pins are exemplary only. In any case, each flex via, in turn, is shown in subsequent figures conductively connected to circuitry (see FIGS. 4A, 4B, and 4C) within the coupling member 18. Accordingly, when the pins 20a-20d extend through the flex vias, the pins 20a-20d are then coupled to the circuitry inside the coupling member 18, as well as any other components to which the corresponding circuitry connects.

In at least one exemplary implementation embodiment, the pins 20a-20d are soldered onto the flex vias of the coupling member 18. Other embodiments, however, are contemplated for conductively connecting and/or securing OSAs to circuitry inside the coupling member 18. As such, embodiments in which conductive pins 20 extend through corresponding flex vias are exemplary only.

Figure 3:
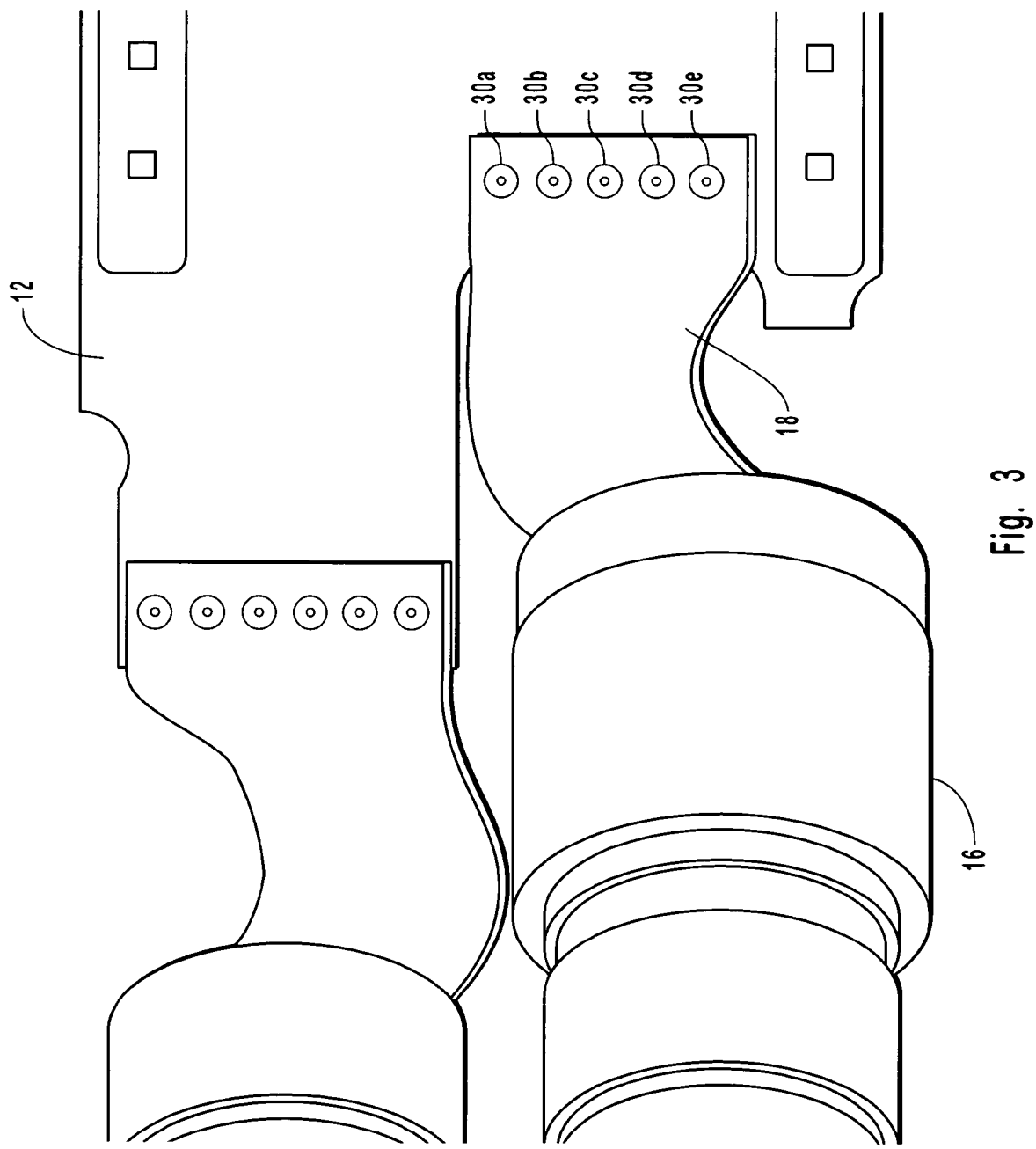
FIG. 3 illustrates a coupling member that is connected to a transceiver substrate in accordance with an exemplary embodiment of the present invention.

In similar fashion, FIG. 3 illustrates how the coupling member 18 can be electrically connected to the transceiver substrate 12 through one or more signal portions/leads and one or more ground portions/leads. In particular, electrically conductive portions 30a-30e (sometimes collectively referred to herein as electrically conductive "portions 30") of the coupling member 18 electrically connect to leads (not shown) located near an edge of the transceiver substrate 12. The leads, in turn provide communicable connections between an OSA and various other active and/or passive circuitry components on the transceiver substrate 18. As with the connections between the OSAs and coupling member 18, the conductive portions 30 can be soldered on to the conductive leads, although other methods for connecting the conductive portions 30 and conductive leads may suffice.

Furthermore, different conductive portions/leads of the coupling member 18 can provide conduits for different electrical functions. For example, as will be detailed with particularity in FIGS. 4A-4C, conductive portions 30a and 30e can connect to corresponding leads on the transceiver substrate 12 that connect to signal ground. In addition, portions 30b and 30d can connect to corresponding leads on the transceiver substrate 12 that connect to various active and/or passive circuitry components (e.g., one or more capacitors, as well as a laser driver, and so forth). In particular, 30b and 30d will generally provide corresponding current in and current out between the laser driver and the components within the OSA. A manufacturer may choose to implement yet additional connections inside the OSA such as through portion 30c. In at least one embodiment, portion 30c is connected to a back-facet photo-diode, or a monitor photo-diode (MPD).

Figure 4A:
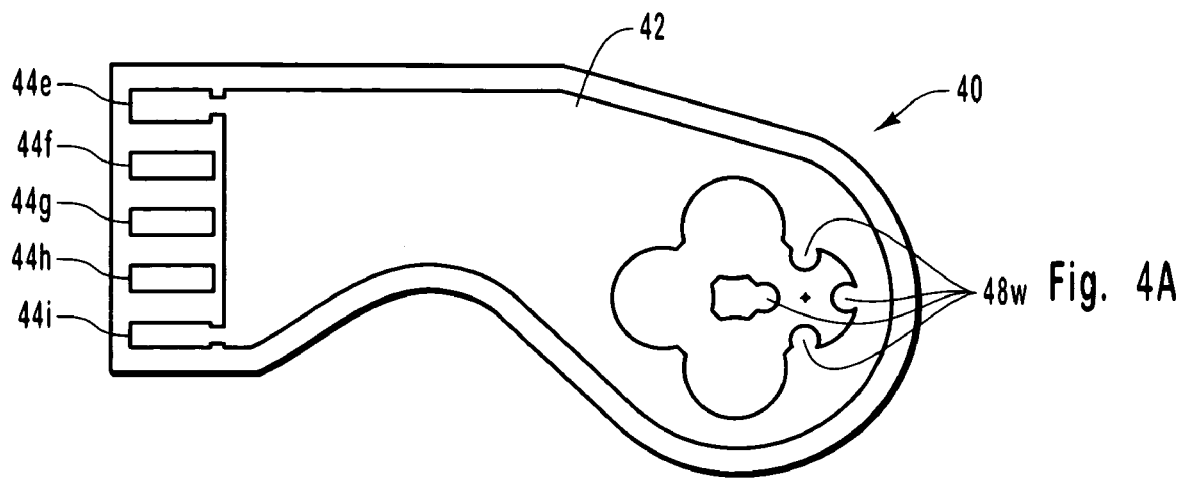
FIGS. 4A, 4B, and 4C illustrate views of a top layer, a middle layer, and a bottom layer of a coupling member in accordance with an exemplary embodiment of the present invention.
Figure 4B:
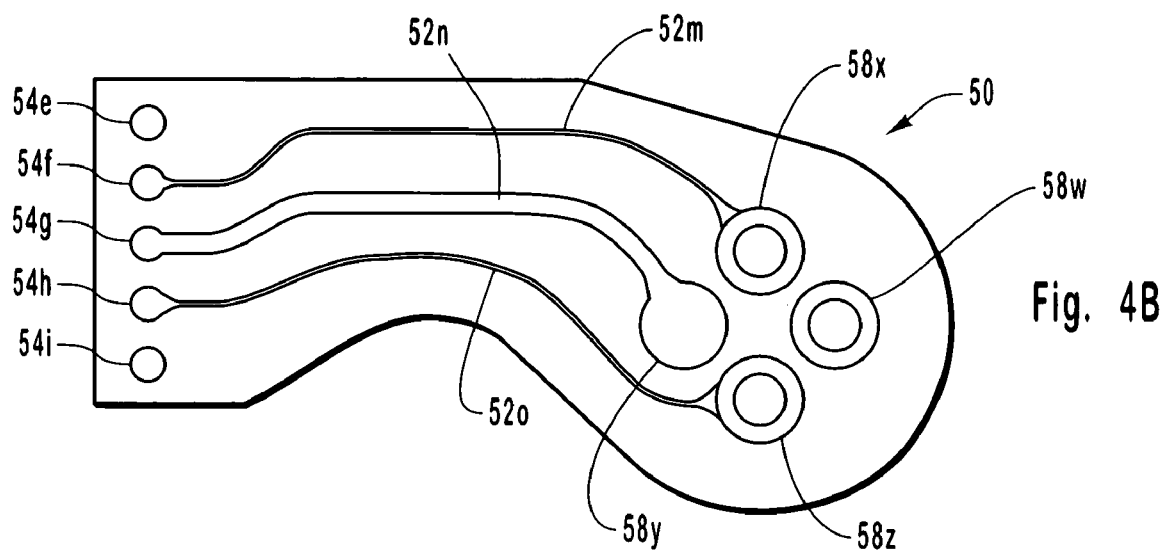
Figure 4C:
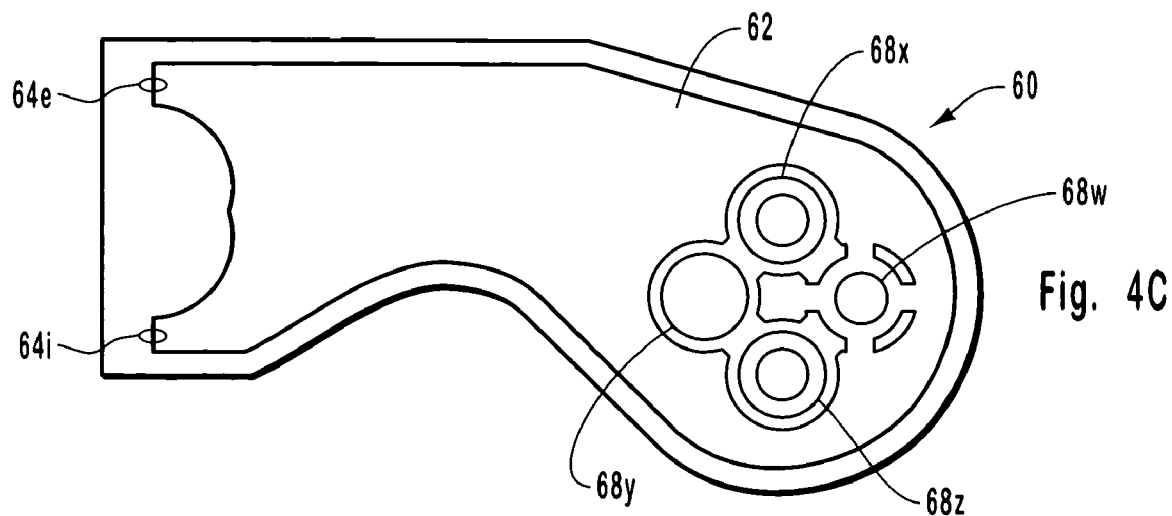

FIGS. 4A, 4B, and 4C illustrate respective top, middle, and bottom exemplary layers of a three-layered coupling member 18 in accordance with at least one aspect of the present invention. In particular, FIGS. 4A and 4C comprise top and bottom (or first and second) primarily ground portions 42 and 62, respectively, while the middle layer 50 is primarily a signal trace portion that includes signal traces 52m, 52n, and 52o. By way of explanation, each layer can comprise a suitable material, such as a flexible dielectric material (e.g., polyimide film) that is suitable for constructing a flexible printed circuit board. Each trace embedded on a layer can comprise copper wires, as with a conventional printed circuit board, that have been adhered to the polyimide material using a suitable adhesive.

With respect to FIG. 4A, the ground portion 42 on the top layer 40 includes ground pad connection vias 44a and 44e. For the purposes of this specification and claims, the term "via" refers to a path through two or more layers such as where two or more layers have an overlapping hole through which a connection pin (e.g., pin 20a) extends. Alternatively, a "via" can also refer to electrical connections between layers at overlapping conductive points, such as between overlapping conductive points between two or more layers such that the layers provide a common point of electrical contact when the layers of the via are assembled together as the coupling member 18. For the purposes of this specification and claims, therefore, a via will be identified herein by a common letter at the end of an item number. For example, items 44e, 54e, and 64e will be understood to be different points or layers of the same via e, while items 44i, 54i, and 64i will be understood to be different points or layers of the same via i.

FIG. 4A shows a ground portion 42 that is a separate grounding material plane adhered to the top layer 40. A suitable such grounding material plane comprises a conducting layer (such as copper) adhered to the dielectric flex material. Ground plane 42 is configured such that when coupling member 18 is assembled, ground pads 44e and 44i are in electrical connection with portions 48w, which are part of via w. Since via w (i.e., 48w, 58w, and 68w when coupling member 18 is assembled) receives the pin connected to the TOSA shell (pin 20a), ground pads 44e and 44i are also communicably connected to the TOSA shell, and thus provide a portion of the common mode ground return path.

In addition, top layer 40 includes conductive pads 44f, 44g, and 44h, which are each different points of vias f, g, and h, respectively. Furthermore, conductive pads 44f, 44g, and 44h are positioned such that when the coupling member 18 is assembled, the conductive pads 44f, 44g, and 44h are in electrical connection with via points 54f, 54g, and 54h (see FIG. 4B), which are layers or points of vias f, g, and h, respectively. In addition, via points 54f, 54g, and 54h are in turn connected to traces 52m, 52n, and 52o, respectively, which are electrically connected to vias x, y, and z (through via points 58x, 58y, and 58z, respectively. Accordingly, since TOSA pins 20b, 20c, and 20d extend through the flex vias w, x, and y, which are connected as described above, TOSA pins 20b, 20c, and 20d are in electrical connection with via points 44b, 44c, and 44d.

FIG. 4C further illustrates the bottom layer 60 which has a ground plane 62 shaped the same as the ground plane 42 of the top layer 40, where the flex vias 68x, 68y, and 68z are simply via points along vias x, y, and z, respectively. In addition, when the coupling member 18 is assembled, the ground plane 62 electrically connects pin 20a (which extends through via point 68w) to the two signal ground vias e and i, by virtue of via points 64e and 64i, respectively. Flex via w, therefore, electrically connects pin 20a to vias e and i at two different layers (layers 40 and 60), and thus through two different ground planes (ground plane 42 and ground plane 62).

In addition, as will be detailed hereinafter, vias e and i are connected to a capacitor 94 on transceiver substrate 12, where the other side of capacitor 94 is connected to signal ground. Due to capacitor 94 being connected as such, AC can pass from the TOSA 16 shell to signal ground on the transceiver substrate 12, while DC cannot. This ensures that there is no DC connection between signal ground and chassis ground.

By way only of explanation and not of limitation, when the top layer 40, the middle layer 50, and the bottom layer 60 are combined with a suitable adhesive (e.g., an adhesive suitable for binding a dielectric material), the combined thickness of the coupling member 18 may range from approximately 7 to 12 mils. Although this thickness can limit how much a coupling member 18 can be bent, this limit can be set by a manufacturer of the coupling member 18 as a function of the bend radius, and as a function of the thickness of the coupling member 18.

For the purposes of this specification and claims, a "bend radius" indicates the radius of a circle that would fit into the bent portion of the coupling member 18. Since the bend radius is set conservatively for applications where the coupling member is bent repeatedly, the radius can be exceeded when the coupling member is used in an application like an optical transceiver where there is no repeated bending involved. Thus, even though increasing the thickness of the coupling member would normally mean that the coupling member cannot be bent as much, the three-layered coupling member 18 of the invention may be used in similar fashion to a thinner conventional coupling member in an optical transceiver without increasing the risk of breakage or damage to the coupling member.

Figure 5:
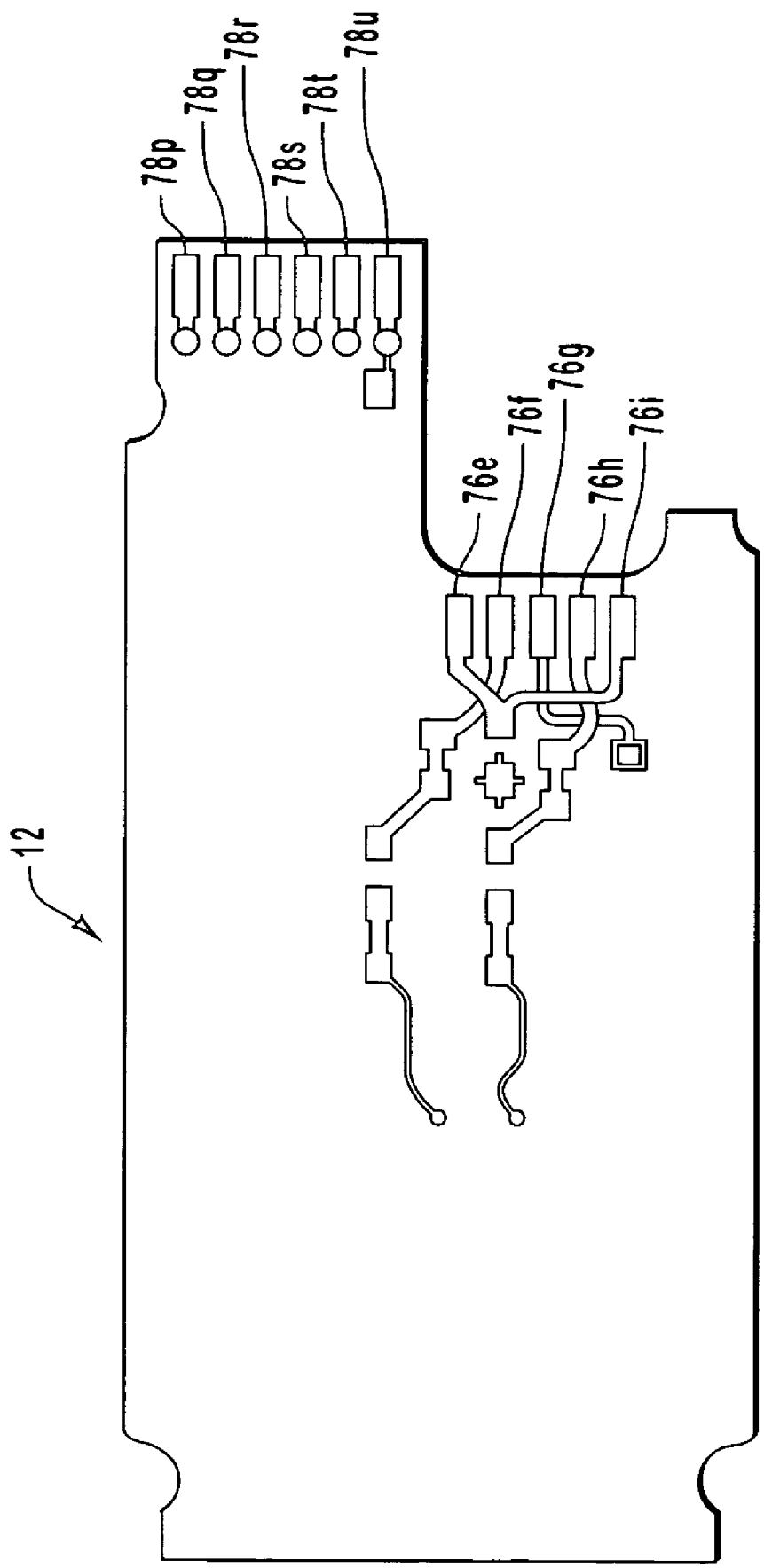
FIG. 5 illustrates an exemplary transceiver substrate that can be used in optical transceiver in accordance with an exemplary embodiment of the present invention.

FIG. 5 depicts an exemplary transceiver substrate 12 that may be used to assemble the optical transceiver 10 in accordance with the invention. In general, the exemplary transceiver substrate 12 can be configured to accommodate the ROSA 14 and the TOSA 16, and comprises a first set of leads 76e, 76f, 76g, 76h, and 76i for the TOSA 16; and comprises a second set of leads 78p, 78q, 78r, 78s, 78t, and 78u for the ROSA 14. As mentioned above, leads 76e and 76i are ground leads that connect to vias e and i (see FIGS. 4A, 4B, and 4C). By contrast, leads 76f, 76g, and 76h are signal trace leads that connect to the pins 20a, 20b, and 20c through vias f, g, and h, which are electrically connected to vias x, y, and z through which the pins extend, respectively.

Figure 6:
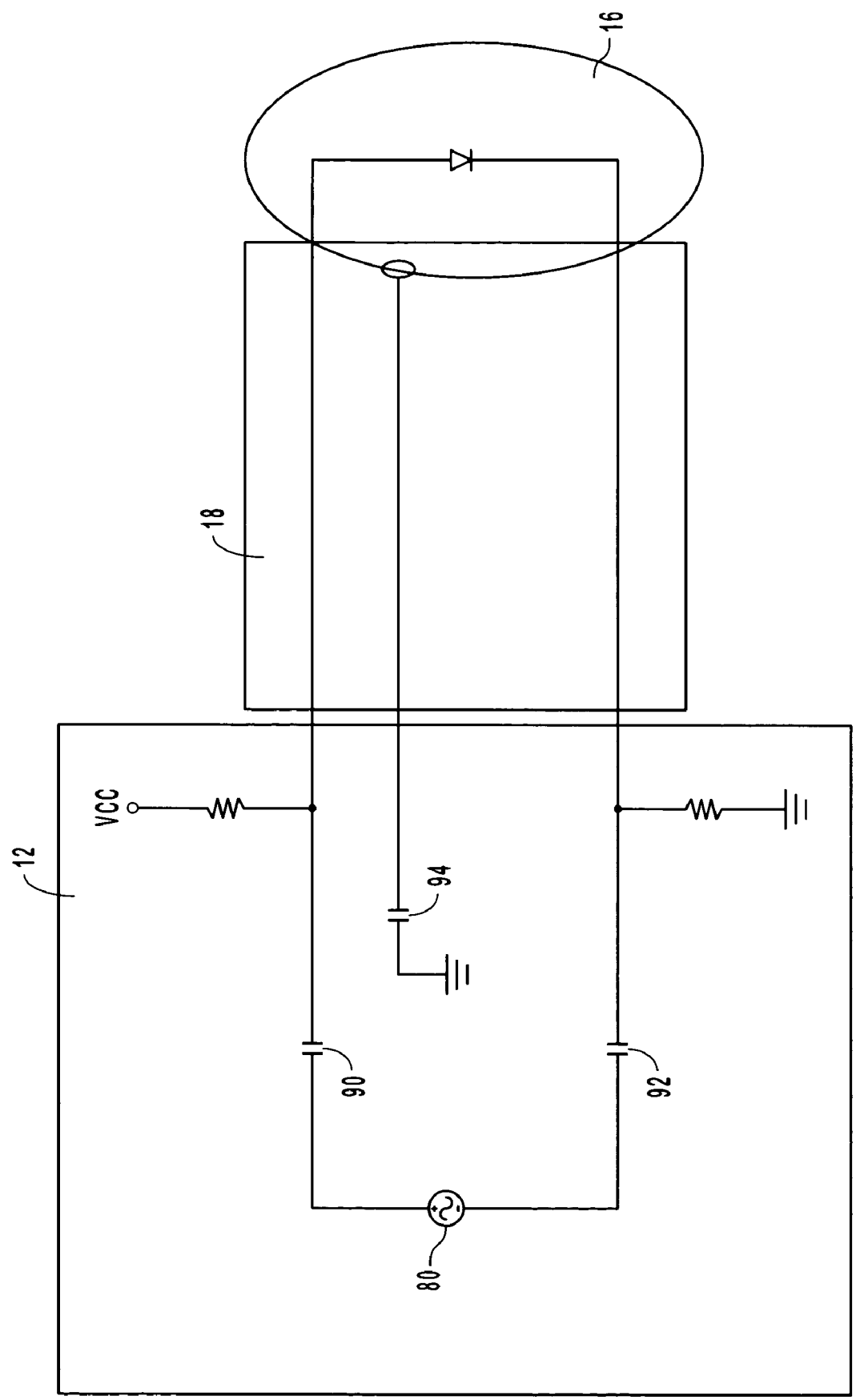
FIG. 6 illustrate an exemplary return path for a subassembly ground signal in accordance with an exemplary embodiment of the present invention.

FIG. 6 depicts the portion of the circuitry on the transceiver substrate 12 including an optical signal source (e.g., a laser diode or light emitting diode) driver 80 and the TOSA 16. The TOSA 16 receives AC signals generated by the optical signal source driver 80 through signal coupling capacitors 90 and 92. Since the signal coupling capacitors (C1) 90 and (C2) 92 transmit differential signals, they provide a return path for the differential (non-common-mode) portion of the signals from the TOSA 16. Common mode signals from the laser driver that do not travel through this return path, if any, may couple to the OSA shell and return through a common mode grounding capacitor (C3) 94 such that it does not radiate from the OSA.

The preferred size of the signal coupling capacitors 90 and 92 depends on the data rate of the signals being transmitted. In one embodiment, for example, each of the signal coupling capacitors 90 and 92 is approximately the same size as a grounding capacitor 94. In particular, the common mode grounding capacitor 94 may be approximately 20%-50% of the combined size of the signal coupling capacitors 90 and 92. Furthermore, the length of the signal path from the optical signal source driver 80 to the TOSA 16 through one of the coupling capacitors 90 and 92 is preferably equal to the length of the signal return path from the TOSA 16 through the grounding capacitor (C3) 94.

Use of the three-layered coupling member 18 in accordance with the invention provides a number of advantages. The signal coupling capacitors 90 and 92, for example, effectively make the chassis ground work like signal ground, such as by making an AC connection from the shell of the TOSA 16 through capacitor 94 to signal ground, thereby providing a ground return path for the common mode signal. By providing an adequate return path for the common mode signal that enters the TOSA 16, the three-layer flex minimizes electromagnetic radiation otherwise found in conventional optical transceiver designs, at least in part since the AC signal is removed from the body of TOSA 16. With less electromagnetic radiation emitted from the OSA, there is less cross-talk that interferes with proper functioning of the ROSA 14. Moreover, because the signal traces 52b and 52d are sandwiched by the ground portions 42 and 62 of the first and second grounding layers, the coupling member 18 comprises added electromagnetic shielding.

Furthermore, the three-layered coupling member 18 adds stability and robustness to the coupling mechanism between a given OSA and the transceiver substrate 12. For example, the flexibility of the coupling member accommodates a certain amount of stress that is inherent in plugging and unplugging an optical cable into a given OSA in the optical transceiver 10. Moreover, the presence of two ground planes in the three-layered coupling member 18 makes the coupling member 18 less inductive for the ground return. Less inductance in the ground is appropriate due to lower impedance, which is particularly useful for high speed signals.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

We claim:

1. A system configured for minimizing electromagnetic radiation in an optical transceiver comprising:
   an optical subassembly;
   a transceiver substrate; and
   a coupling member that communicatively couples the optical subassembly to the transceiver substrate, wherein the coupling member comprises:
      a signal trace layer that provides one or more signal pathways between the optical subassembly and the transceiver substrate;
      a first ground plane layer positioned on a first side of the signal trace layer; and
      a second round plane layer positioned on a second side of the signal trace layer, wherein at least one of the first or second ground plane layers connect a body of the optical subassembly to a common mode grounding capacitor.

2. The system as recited in claim 1, wherein the optical subassembly is a transmitter optical subassembly.

3. The system as recited in claim 2, further comprising a receiver optical subassembly.

4. The system as recited in claim 1, wherein the signal trace layer comprises one or more traces that are connected to one or more of the laser source, a back facet photodiode, and a monitor photodiode.

5. The system as recited in claim 1, wherein the one or more ground plane layers further comprise a copper film adhered to the ground plane layers, wherein the copper film provides electromagnetic shielding.

6. The system as recited in claim 1, wherein the optical transceiver is configured for any one of 2.5 gigabit, 4.0 gigabit, and 10.0 gigabit communication speeds.

7. The system as recited in claim 1, further comprising one or more signal coupling capacitors positioned on the transceiver substrate, wherein the one or more signal coupling capacitors are positioned on any of an in and an out path for alternating current.

8. The system as recited in claim 7, wherein the optical signal source is one of a laser diode and a light emitting diode.

9. A method of minimizing electromagnetic radiation in an optical subassembly during high frequency data transfers using a multilayered coupling member, comprising the acts of:
   transferring a high frequency electrical signal between a transceiver substrate and an optical subassembly through a multilayered coupling member, wherein the multilayered coupling member includes a signal trace layer, a first around plane layer positioned on a first side of the signal trace layer and a second ground plane layer positioned on a second side of the signal trace layer; and discharging a common mode signal that builds on the optical subassembly through a common mode grounding capacitor.

10. The method of shielding an optical subassembly as recited in claim 9, further comprising an act of shielding electromagnetic radiation that emanates from a signal layer of the multilayered coupling member with one or more ground plane layers of the multilayered coupling member.

11. The method of shielding an optical subassembly as recited in claim 10, wherein the one or more ground plane layers comprise an insulating film adhered to the one or more ground plane layers.

12. The method of shielding an optical subassembly as recited in claim 11, further comprising coupling the signal layer of the multilayered coupling member to a signal coupling capacitor, such that the signal coupling capacitor isolates DC current at a capacitor that is different from the common mode grounding capacitor.

13. A system configured for minimizing electromagnetic radiation in an optical transceiver comprising:
an optical subassembly;
a transceiver substrate; and
a coupling member that communicatively couples the optical subassembly to the transceiver substrate, wherein the coupling member comprises:
a signal trace layer that provides one or more signal pathways between the optical subassembly and the transceiver substrate; and
one or more ground plane layers that connect a body of the optical subassembly to a common mode grounding capacitor, wherein the common mode grounding capacitor is implemented on the transceiver substrate and has a first terminal coupled to the body of the optical subassembly and a second terminal coupled to a ground.

14. The system as recited in claim 13, wherein the optical subassembly is a transmitter optical subassembly.

15. The system as recited in claim 14, further comprising a receiver optical subassembly.

16. The system as recited in claim 13, wherein the signal trace layer comprises one or more traces that are connected to one or more of the laser source, a back facet photodiode, and a monitor photodiode.

17. The system as recited in claim 13, wherein the one or more ground plane layers further comprise a copper film adhered to the ground plane layers, wherein the copper film provides electromagnetic shielding.

18. The system as recited in claim 13, wherein the optical transceiver is configured for any one of 2.5 gigabit, 4.0 gigabit, and 10.0 gigabit communication speeds.

19. The system as recited in claim 13, further comprising one or more signal coupling capacitors positioned on the transceiver substrate, wherein the one or more signal coupling capacitors are positioned on any of an in and an out path for alternating current.

20. The system as recited in claim 19, wherein the optical signal source is one of a laser diode and a light emitting diode.

* * * * *

UNITED STATES PATENT AND TRADEMARK OFFICE
CERTIFICATE OF CORRECTION

PATENT NO. : 7,338,216 B2
APPLICATION NO. : 10/814327
DATED : March 4, 2008
INVENTOR(S) : Burdick et al.

Page 1 of 1

It is certified that error appears in the above-identified patent and that said Letters Patent is hereby corrected as shown below:

Column 1
Line 11, change "its" to --their--

Column 3
Line 43, change "in optical" to --in an optical--
Line 45, change "illustrate" to --illustrates--

Column 5
Line 51, change "44a and 44e." to --44e and 44i.--

Column 6
Line 26, change "w, x, and y" to --x, y, and z--
Line 28, change "44b, 44c, and 44d" to --44f, 44g, and 44h--

Column 7
Line 13, change "76eand" to --76e and--
Line 16, change "20a, 20b, and 20c" to --20b, 20c, and 20d--
Line 52, change "three-layer flex" to --three-layered coupling member 18--
Line 58, change "52b and 52d" to --52m, 52n, and 52o--

Column 8
Claim 1, line 28, change "round" to --ground--
Claim 9, line 64, change "around" to --ground--

Signed and Sealed this

Third Day of August, 2010

David J. Kappos
*Director of the United States Patent and Trademark Office*